(12) United States Patent
Yun

(10) Patent No.: US 7,465,979 B2
(45) Date of Patent: Dec. 16, 2008

(54) SEMICONDUCTOR DEVICE AND FABRICATION METHOD THEREOF

(75) Inventor: Hyung Sun Yun, Bucheon-si (KR)

(73) Assignee: Dongbu Electronics Co., Ltd., Seoul (KR)

(*) Notice: Subject to any disclaimer, the term of this patent is extended or adjusted under 35 U.S.C. 154(b) by 175 days.

(21) Appl. No.: 11/644,204

(22) Filed: Dec. 22, 2006

(65) Prior Publication Data

US 2007/0158751 A1 Jul. 12, 2007

(30) Foreign Application Priority Data

Dec. 29, 2005 (KR) .................. 10-2005-0133575

(51) Int. Cl.
*H01L 29/94* (2006.01)
*H01L 21/8234* (2006.01)

(52) U.S. Cl. .................. 257/288; 257/217; 257/250; 257/279; 257/E31.109

(58) Field of Classification Search .................. 257/288, 257/217, 250, 279, 331, 365
See application file for complete search history.

(56) References Cited

U.S. PATENT DOCUMENTS 6,632,710 B2 * 10/2003 Takahashi .................... 438/149
2005/0087802 A1 * 4/2005 Park .......................... 257/335

* cited by examiner

*Primary Examiner*—Minh-Loan Tran
*Assistant Examiner*—William Harriston
(74) *Attorney, Agent, or Firm*—Andrew D. Fortney

(57) ABSTRACT

In order to diversify a current control method of a semiconductor device, improve performance (including a current drive performance) of the semiconductor device, and reduce a size of the semiconductor device, a second gate may be formed inside a substrate that forms a channel upon applying a bias voltage thereto. In one aspect, the semiconductor device includes: a well region of a first conductivity; source and drain regions of a second conductivity in the well region; a first gate on an oxide layer above the well region, controlling a first channel region of a second conductivity between the source region and the drain region; and a second gate under the first channel region.

12 Claims, 2 Drawing Sheets

SEMICONDUCTOR DEVICE AND FABRICATION METHOD THEREOF

BACKGROUND OF THE INVENTION

1. Field of the Invention

The present invention relates to a semiconductor device, and more particularly, to a Metal Oxide Semiconductor (referred to as 'MOS' hereinafter) transistor and a method for fabrication the same.

2. Description of the Related Art

In an MOS transistor, impurities are implanted and diffused in a semiconductor substrate such as silicon to make a source region and a drain region. A voltage is applied to the substrate and a gate isolated by an insulating layer such as an oxide layer to control a channel formation between the source and the drain. When a channel is formed by the gate voltage, an electric current flows between the source and the drain to cause the transistor become conductive. In contrast to this, when the channel is not formed, the transistor remains non-conductive, in which the electric current does not flow.

A MOS transistor according to the related art is either a 3 terminal device including a gate, a source, and a drain, or a 4 terminal device including the gate, the source, and the drain, and the substrate or a well electrode. An operation of the MOS transistor is controlled according to a bias voltage applied to the gate thereof. Accordingly, a method for controlling an electric current may be limited, and there is a limit to a current drive performance.

Moreover, so as to secure a voltage, the gate electrode should have a greater size than a predetermined value. Accordingly, it has a problem in that the size of the semiconductor device cannot be reduced.

SUMMARY OF THE INVENTION

Accordingly, the present invention is directed to a semiconductor device and a method for fabricating the same that substantially obviates one or more problems due to limitations and disadvantages of the related art.

An object of the present invention is to provide a semiconductor device and a method for fabricating the same, which diversify current control and increase performance of a transistor by changing a construction of the semiconductor device.

Another object of the present invention is to provide a semiconductor device and a method for fabricating the same, which reduce a size of the semiconductor device by improving a current drive performance thereof.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a semiconductor device comprising: a well region having a first conductivity; source and drain regions having a second conductivity in the well region; a first gate on an oxide layer above the well region, controlling formation of a first channel region of a second conductivity between the source region and the drain region; and a second gate under the first channel region.

In another aspect of the present invention, there is provided a semiconductor device comprising: a substrate; a well region in the substrate; source and drain regions at a surface of the substrate; an oxide layer above the well region; a first gate on the oxide layer, controlling formation of first channel region between the source region and the drain region; a first power source for applying a first power to the first gate; a second gate under the first channel region, controlling formation of a second channel region adjacent to the first channel region; and a second power source for applying an external power to the first gate.

In a further aspect of the present invention, there is provided a method for fabricating a semiconductor device, comprising: implanting impurities in a substrate to form a gate; forming a plug at an end of the gate such that the plug is exposed to an exterior of the substrate; and forming a metal wiring at a surface of the substrate in contact with the plug.

According to the present invention, unlike a semiconductor device according to the related art, a gate is formed inside the substrate and a second gate is additionally provided to form a channel upon applying a bias voltage thereto. The current control of the semiconductor device is thus diversified, performance (including a current drive performance) of the semiconductor device may be improved, and a size of the semiconductor device may be reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
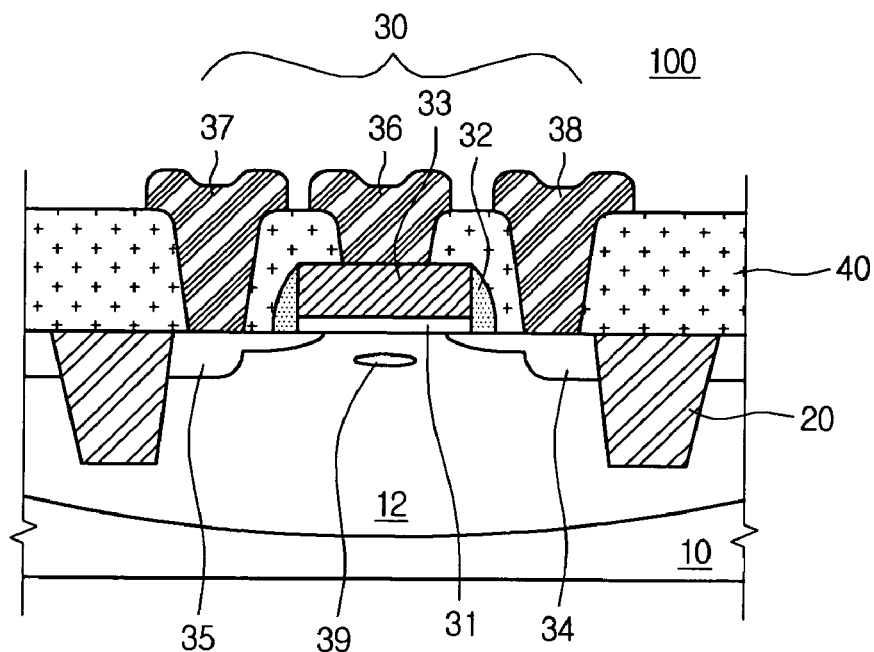
FIG. 1 is a cross-sectional view showing a construction of a transistor according to an embodiment of the present invention.

FIG. 1 is a cross-sectional view showing a construction of a transistor according to an embodiment of the present invention.

With reference to FIG. 1, in the semiconductor device of the present invention, an active region 30 is formed at a well region 12 of a semiconductor substrate 10, for example, a silicon substrate, which is insulated and/or isolated by device isolation layers 20. A drain 34 and a source 35 are formed in the well region by an ion implantation or a diffusion process. A gate oxide layer 31 is formed on a substrate surface of the well region 12 (typically by wet or dry thermal oxidation), and a first gate 33 is formed thereon. For example, the gate oxide layer 31 may comprise or consist essentially of $SiO_2$, and the first gate 33 may comprise polysilicon with an optional metal silicide layer thereon.

Insulating spacers 32 are formed at sidewalls of the gate oxide layer 31 and the first gate 33, typically by conformal deposition of one or more insulator materials and anisotropic etching. The spacers 32 cause the drain 34 and the source 35 to be self aligned. A lightly doped drain (LDD) structure may be formed in the substrate prior to formation of the spacers 32. That is, prior to the spacers 32, ions may be implanted in the substrate using the first gate as a mask to form low concentration source/drain regions. Then, the spacers 32 are formed. Next, ions are again implanted in the substrate in a high concentration using the spacers 32 as a mask to make source/drain regions 34 and 35 overlapping with the LDD structure (s). The first gate 33, the drain 34, and the source 35 are electrically connected to exterior signals through connectors 36, 38, and 37 thereof, respectively.

As described above, for example, the semiconductor device of the present invention will be described as an embodiment. There are two types of CMOS transistors, which include NMOS transistors and PMOS transistors. The NMOS transistor includes a p-type substrate and source/drain regions. The source/drain regions are formed in a p-type well. The source and drain comprise N-type impurities in the substrate on opposite sides of the (top) gate (e.g., gate 33). Further, the PMOS transistor includes an N-type substrate and source/drain regions. The source/drain regions are formed in the N-type well.

Here, an operation of the NMOS transistor will now be explained. First, when a negative (−) bias voltage is applied to a first gate 33, holes present at the first gate 33 enter the substrate to form a depletion layer. In this state, when a positive (+) voltage is applied to the drain 34, an N-type channel starts to be produced from a substrate region in the vicinity of the drain, and gradually extends in the direction of the source 35 in proportion to an increase of a drain voltage, so that a channel connecting the source 35 to the drain 34 is formed at a substrate region under the first gate 33 at a characteristic voltage for a given transistor. The channel formation process of the PMOS transistor is identical with that of the NMOS transistor, but the voltage applied to the gate is complementary to that of the NMOS transistor.

The present invention controls the depletion layer and channel formations by the first gate 33 insulated from the substrate as well as a second gate 39 in the substrate. That is, the MOS transistor according to the present invention is a 5 terminal device, which includes a first gate, a source, a drain, a well, and a second gate. By providing two gates, a voltage applied to a (top) gate for driving the same current is reduced. Accordingly, it also functions for a shallow area as a gate electrode, power consumption is reduced, and a current driving force is enhanced.

In order to form the second gate 39, for example, a pocket ion implantation method is used. The pocket ion implantation method implants ions in a predetermined region of a semiconductor substrate by controlling the ions (which have a relatively high energy) sufficiently to penetrate and enter a predetermined region of the semiconductor substrate. Since a depth of the ions implanted in the semiconductor substrate is adjusted according to the energy of the ions, the implant depth can be selected to a value suitable for a particular use or purpose. The most important advantage of the pocket ion implantation method may be the ability to precisely or exactly adjust the number of impurity atoms to be implanted in the semiconductor substrate.

After the pocket ion implantation, when the semiconductor substrate is thermally heated to anneal an implanted region, an exact impurity concentration in the semiconductor substrate can be obtained, ranging from $10^{14} \sim 10^{21}$ atoms/cm$^3$, and the penetration depth of the impurity can be adjusted by the energy.

On the other hand, among the ion implantation process, the pocket ion implantation process implants ions in a portion of the substrate below the first gate 33. For example, it implants ions below the first gate 33 at an implantation angle of 15-45° (e.g., in one embodiment, about 30 degrees). When the second gate 39 is formed by the pocket ion implantation method, the first gate 33 can be used as a mask, or a separate mask can be used (e.g., areas of the substrate can be photolithographically masked other than the region in which the second gate is formed, then the ions can be implanted directly into the substrate (e.g., at an angle of about 0°), prior to formation of the first gate 33. Thus, the conditions of forming the second gate 39 can be changed according to a formation order of the first gate 33 and the second gate 39.

So as to make a pocket ion implantation mask, a photoresist layer pattern should be formed. For example, hexamethyl disilazane (HMDS) may be injected above or deposited on an oxide layer to increase an adhesive force between the photoresist layer and the oxide layer, the photoresist layer is coated onto the substrate while it is rotated to form a uniform photoresist layer on the substrate, and then a soft bake may be performed to remove solvent(s) present in the photoresist layer. Then, the photoresist layer is exposed to light passed through a photo mask having a predetermined pattern thereon to transfer the pattern of the photo mask to the photo resist layer. Then, the exposed photoresist is developed. Through this procedure, a pocket photoresist pattern may be formed. It is preferred to form an edge of the pocket photoresist layer pattern in a circle or rounded shape by a special thermal treatment.

Next, ions are implanted in a substrate using the pocket photoresist pattern as a mask to form a second gate region 39 to a predetermined depth in the substrate. A location and a distribution of the second gate 39 can be varied by adjusting amount of the impurity ions, an implantation angle, and the implantation energy.

Here, the same kind (conductivity type) of ions as the source 35 and the drain 34 are used to form the second gate 39. As a case of a general MOSFET, the ions can be preferably applicable to a case that a channel is formed under the gate oxide layer 31. However, in a case of a semiconductor device in which a channel is formed to a predetermined depth below the gate oxide layer 31, for example, in a case of a buried channel MOSFET, when a gate voltage is applied, various kinds of impurities can be selectively used according to a force for pushing charges into and/or through the channel.

Figure 2:
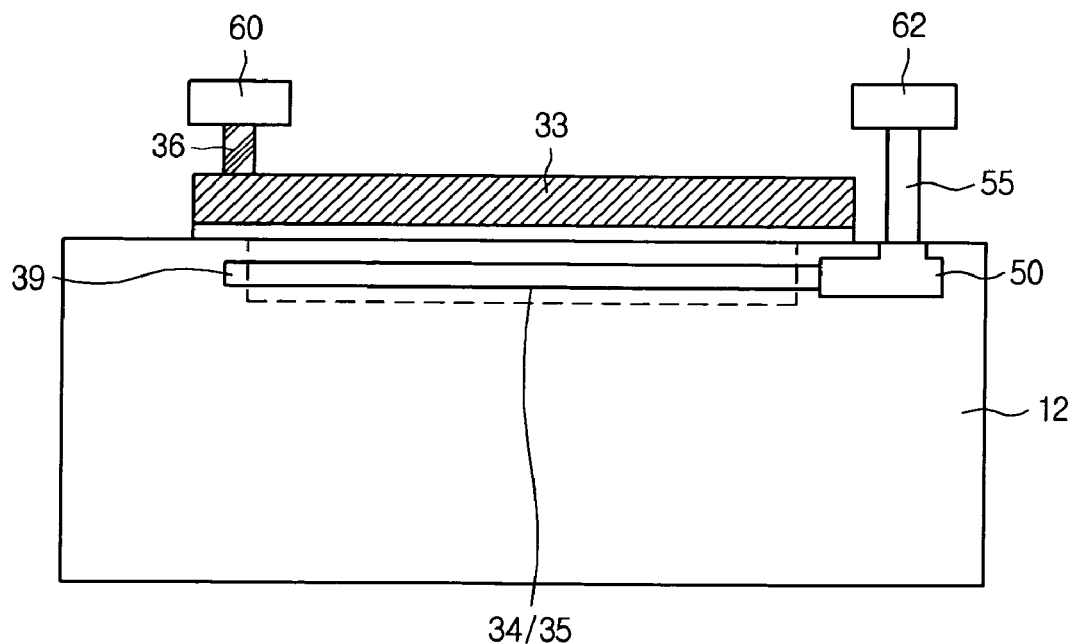
FIG. 2 is a cross-sectional view showing a transistor of FIG. 1 taken along a length direction of a gate electrode.
Figure 3:
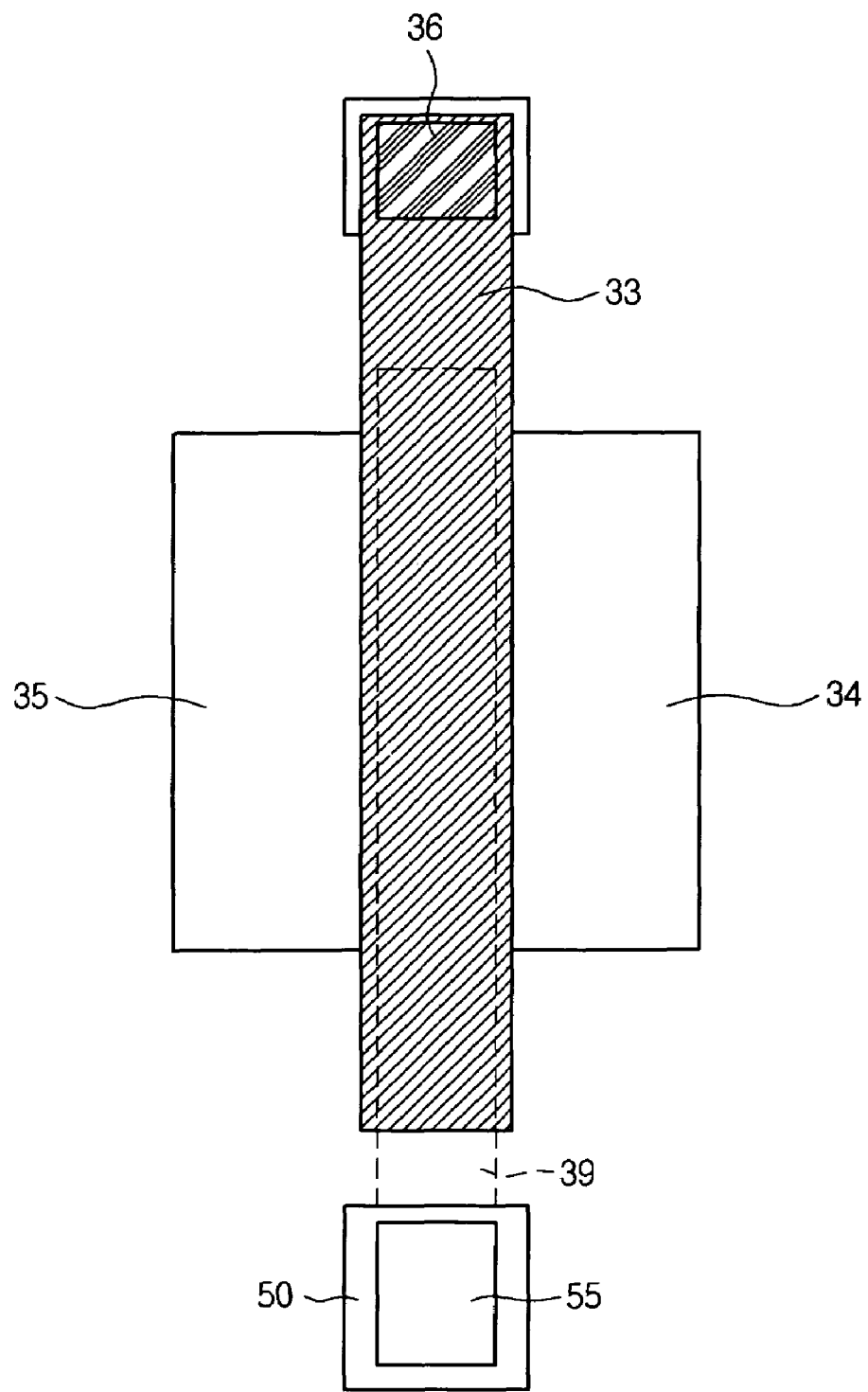
FIG. 3 is a plan view showing a transistor according to the present invention.

FIG. 2 is a cross-sectional view showing a transistor of FIG. 1 taken along a length direction of a gate electrode. FIG. 3 is a plan view showing a transistor according to the present invention.

With reference to FIGS. 2 and 3, the second gate 39 is arranged parallel with the first gate 33, and is formed under a first channel region, which is formed in a substrate well region 12 under the first gate 33. The second gate 39 is connected to a second gate electrode 62 through a plug 50 in the substrate and a connector 55. The first gate 33 is connected to the first gate electrode 60 through a connector 36. It is more preferred that the plug 50 and the connector 55 are formed on the opposite side of the connector 36 to the first gate 33 in order to reduce an area of a semiconductor device or secure a space thereof.

Here, the method for manufacturing the second gate 39, the plug 50, and the connector 55, preferably comprises forming the second gate 39, then the plug 50, followed by the connector 55.

This is related to the method for fabricating the plug 50 and the connector 55. The following is a description of an exemplary method for fabricating such parts.

First, a high concentration of impurities may be implanted at an end of the second gate 39 to fabricate the plug 50 functioning as a conductive line. In this case, after a formation of the plug 50, the plug 50 may be etched and/or a metal wiring may be formed on the plug 50, with the result that the connector 55 can be manufactured.

Further, two other methods are applicable to fabricating the plug 50. In a first method, a trench is formed at an end of the second gate 39 and polysilicon (e.g., the same layer as for a gate poly) in which impurities are implanted is deposited in the trench. In a second method, a metal such as tungsten or copper is filled in the trench.

On the other hand, prior to formation of the second gate 39, the plug 50, and the connector 55, the well region 12, a source 35 and drain 34, a gate oxide layer 31, and a first gate 33 may be sequentially formed on the substrate 10. However, the second gate 39 can be further formed prior to a formation of the gate oxide layer 31.

In this state, when a bias voltage is applied to the second gate 39, a second channel may be formed in the substrate region between the second gate 39 and the first channel. Accordingly, a drive current can be variously controlled and a current drive performance can be increased through the second channel.

Although the embodiment of the present invention has been described that the second gate is formed using a pocket ion implantation method, an epitaxial growth method can be used. Namely, after a second gate region has been formed in the well region of the substrate, an epitaxial layer of silicon may be grown on the exposed substrate, then source/drain regions can be formed therein by the above method(s) to manufacture the second gate as a buried structure.

Moreover, although the embodiment of the present invention has been described that the first gate 33 is used, the present invention is not limited. For example, where the first gate 33 is not provided, a semiconductor device according to the present invention can operate by only the second gate 39. However, it is preferred that the first gate and the second gate are simultaneously used in order to improve the reliability of an operation and a current drive force, and reduce power consumption and a size.

According to the present invention, unlike a semiconductor device according to the related art, a gate is formed in the substrate, and a second gate is additionally provided to form a channel upon applying a bias voltage thereto. This diversifies the current control method of the semiconductor device, improves performance (including a current drive performance) of the semiconductor device, and enables reduction of the size of the semiconductor device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device comprising:
   a well region having a first conductivity;
   a source region having a second conductivity in the well region;
   a drain region having a second conductivity in the well region;
   a first gate on an oxide layer above the well region, controlling a first channel region having a second conductivity between the source region and the drain region; and
   a second gate under the first channel region.

2. The semiconductor device according to claim 1, wherein the second gate is parallel to the first gate.

3. The semiconductor device according to claim 1, wherein the second gate comprises a pocket ion implantation region.

4. The semiconductor device according to claim 1, wherein the second gate controls a second channel region having a second conductivity in a substrate region between the first channel region and the second gate.

5. The semiconductor device according to claim 1, further comprising a plug in the substrate at an end of the second gate; and
   a connector connecting an exterior of the substrate to the plug.

6. The semiconductor device according to claim 1, wherein the second gate comprises impurities identical with or different from those of the source and the drain, and the second gate has a depth greater than/less than/equal to that of the channel.

7. The semiconductor device according to claim 1, wherein the plug comprises polysilicon or a metal in a trench in the substrate.

8. The semiconductor device according to claim 1, wherein the plug comprises a high concentration impurity region.

9. A semiconductor device comprising:
   a substrate;
   a well region in the substrate;
   a source region at a surface of the substrate;
   a drain region [on the opposite side of the source region centering around the well region];
   an oxide layer above the well region;
   a first gate on the oxide layer, controlling formation of first channel regions of a second conductivity between the source region and the drain region;
   a first power source for applying a first power to the first gate;
   a second gate under the first channel region, controlling formation of a second channel region between the first channel regions; and
   a second power source for applying an external power to the gate.

10. The semiconductor device according to claim 9, wherein the first power source is on the opposite side of the second power source.

11. The semiconductor device according to claim 9, wherein the second power source includes:
    a plug for connecting an end of the second gate to a surface of the substrate; and
    a metal wiring for applying the external power to the plug.

12. The semiconductor device according to claim 9, wherein the second gate comprises an impurity region.

* * * * *